United States Patent
Horsky et al.

(10) Patent No.: US 8,330,118 B2
(45) Date of Patent: Dec. 11, 2012

(54) MULTI MODE ION SOURCE

(75) Inventors: Thomas N. Horsky, Boxborough, MA (US); Richard Goldberg, Melbourne (AU); Sami K. Hahto, Nashua, NH (US)

(73) Assignee: SemEquip, Inc., North Billerica, MA (US)

( * ) Notice: Subject to any disclaimer, the term of this patent is extended or adjusted under 35 U.S.C. 154(b) by 270 days.

(21) Appl. No.: 12/465,250

(22) Filed: May 13, 2009

(65) Prior Publication Data

US 2009/0283695 A1 Nov. 19, 2009

Related U.S. Application Data

(60) Provisional application No. 61/053,934, filed on May 16, 2008.

(51) Int. Cl.
*H01J 27/02* (2006.01)
*H01J 27/08* (2006.01)

(52) U.S. Cl. .................................. 250/423 R; 250/426
(58) Field of Classification Search ............... 250/426
See application file for complete search history.

(56) References Cited

U.S. PATENT DOCUMENTS

| | | | | |
|---|---|---|---|---|
| 5,808,308 A | * | 9/1998 | Holkeboer | 250/423 R |
| 6,203,862 B1 | * | 3/2001 | Bluck et al. | 427/569 |
| 6,452,338 B1 | | 9/2002 | Horsky | |
| 6,686,595 B2 | | 2/2004 | Horsky | |
| 6,744,214 B2 | | 6/2004 | Horsky | |
| 7,107,929 B2 | | 9/2006 | Horsky et al. | |
| 7,459,704 B2 | * | 12/2008 | Olson et al. | 250/492.21 |
| 7,700,925 B2 | * | 4/2010 | Radovanov et al. | 250/423 R |
| 2007/0057172 A1 | * | 3/2007 | Wang | 250/281 |
| 2009/0206270 A1 | * | 8/2009 | Glayish et al. | 250/396 ML |

FOREIGN PATENT DOCUMENTS

| | | | | |
|---|---|---|---|---|
| GB | 2185620 A | * | 7/1987 | |
| JP | 58186139 A | * | 10/1983 | |
| JP | 59101749 A | * | 6/1984 | |

* cited by examiner

*Primary Examiner* — Jack Berman
*Assistant Examiner* — Eliza Osenbaugh-Stewart
(74) *Attorney, Agent, or Firm* — John S. Paniaguas; Katten Muchin Rosenman LLP

(57) ABSTRACT

A multi mode ion implantation system, which operates in both an arc discharge mode of operation and a non arc discharge mode of operation, is described. The multi mode ion implantation system may consist of dual ionization volumes forming two ion sources, an arc discharge source and a non arc discharge source, in tandem. The dual chambers and the two sources feed the ion implantation system with material of various species for multi mode, an arc discharge and a non arc discharge operation.

23 Claims, 7 Drawing Sheets

Mas spectrum of $C_{14}H_{14}$ feed material. The ion produced most copiously in the electron impact source is peaked about 92 amu ($C_7H_x^+$)

MULTI MODE ION SOURCE

CROSS REFERENCE TO RELATED APPLICATIONS

This application claims priority to and the benefit of U.S. Provisional Patent Application No. 61/053,934, filed on May 16, 2008.

BACKGROUND OF THE INVENTION

1. Field of the Invention

The present invention relates to equipment used in semiconductor processing and more particularly to an ion implantation system which includes an ion source having multiple ionization volumes for converting both molecular and elemental gaseous feed material into ion beams for commercial ion implantation production.

2. Description of the Prior Art

Various ion implantation systems are known in the art. For example, U.S. Pat. No. 7,107,929, incorporated herein by reference, discloses a typical commercial ion implanter. FIG. 1 illustrates an ion beam I propagating from the ion source 42 through a transport (i.e. "analyzer") magnet 43, where the ion beam is separated along the dispersive (lateral) plane according to the mass-to-charge ratio of the ions. A portion of the beam is focused by the magnet 43 onto a mass resolving aperture 44. The aperture size (lateral dimension) determines which mass-to-charge ratio ion passes downstream, to ultimately impact the target wafer 55, which typically may be mounted on a spinning disk 45. The smaller the mass resolving aperture 44, the higher the resolving power R of the implanter, where R=M/DELTA M; M being the nominal mass-to-charge ratio of the ion and DELTA.M being the range of mass-to-charge ratios passed by the aperture 44. The beam current passing through the aperture 44 can be monitored by a moveable Faraday detector 46, in which a portion of the beam current reaching the wafer position can be monitored by a second Faraday detector 47 located behind the disk 45. The ion source 42 is biased to have a high voltage and receives gas distribution and power through feed throughs 48. The source housing 49 is kept at high vacuum by a source pump 50, while the downstream portion of the implanter is likewise kept at high vacuum by a chamber pump 51. The ion source 42 is electrically isolated from the source housing 49 by a dielectric bushing 52. The ion beam is extracted from the ion source 42 and accelerated by an extraction electrode 53. In the simplest case, where the source housing 49, implanter magnet 43, and disk 45 are maintained at ground potential, the final electrode of the extraction electrode 53 is at ground potential and the ion source is floated to a positive voltage $V_a$, where the beam energy $E=qV_a$ and q is the electric charge per ion. In this case, the ion beam impacts the wafer 55 with ion energy E. In other types of implanters, such as serial implanters, the ion beam is scanned across a wafer by an electrostatic or electromagnetic scanner, with either a mechanical scan system to move the wafer or another such electrostatic or electromagnetic scanner being employed to accomplish scanning in the orthogonal direction.

Ion beams from conventional ion implanter systems are created by ionizing gaseous feedstock of a dopant material, such as, $BF_3$, phosphine, arsine, etc. Traditionally, Bernas-type ion sources have been used in ion implantation equipment. Such Bernas-type ion sources are known as hot plasma or arc discharge sources and typically incorporate an electron emitter, either a naked filament cathode or an indirectly-heated cathode. This type of ion source generates a plasma that is confined by a magnetic field. The most common mode for ionizing these gases is arc discharge. The arc discharge is created either by a directly heated filament cathode or more commonly by an indirectly heated cathode discharge (IHC). The arc power that ionizes the feed gas can be on the order of 1000 W. The cathode that drives the arc is typically located in or near the ionization chamber volume creating an intense plasma with plasma density on the order of $1E^{12}$ -$1E^{13}/cm^3$. The extracted ion beam currents are typically a few tens of mA and the extraction slot area can vary from 0.5 to 2 $cm^2$.

FIG. 2 illustrates a known technology for commercial ion sources, namely the "Enhanced Bernas" ion source. This type of ion source is commonly used in high current, high energy, and medium current ion implanters. The ion source a is mounted to the vacuum system of the ion implanter through a mounting flange b which also accommodates vacuum feed throughs for cooling water, thermocouples, dopant gas feed, $N_2$ cooling gas, and power. The dopant gas feed c feeds gas into the arc chamber d in which the gas is ionized. Also provided are dual vaporizer ovens e, in which solid feed materials such as As, $Sb_2O_3$, and P may be vaporized. The ovens, gas feed, and cooling lines are contained within a cooled machined aluminum block g. The water cooling is required to limit the temperature excursion of the aluminum block g while the vaporizers, which operate between 100° C. and 800° C., are active, and also to counteract radiative heating by the arc chamber d when the source is active. The arc chamber d is mounted to, but in poor thermal contact with, the aluminum block g. The ion source a is an arc discharge source, which means that it operates by sustaining a continuous arc discharge between an immersed hot-filament cathode h and the internal walls of the arc chamber d. Since this arc can typically dissipate in excess of 300 W, and since the arc chamber d cools only through radiation, the arc chamber can reach a temperature in excess of 800° C. during operation.

The gas introduced to arc chamber d is ionized through electron impact with the electron current, or arc, discharged between the cathode h and the arc chamber d. To increase ionization efficiency, a uniform magnetic field i is established along the axis joining the cathode h and an anticathode j by external Helmholz coils, to provide confinement of the arc electrons. An anticathode j, located within the arc chamber d but at the end opposite the cathode h, is typically held at the same electric potential as the cathode h, and serves to reflect the arc electrons confirmed by the magnetic field i back toward the cathode h and back again repeatedly. The trajectory of the thus confined electrons is helical, resulting in a cylindrical plasma column between the cathode h and anticathode j. The plasma density within the plasma column is typically high, on the order of $10^{12}$ per cubic centimeter; this enables further ionizations of the neutral and ionized components within the plasma column by charge-exchange interactions, and also allows for the production of a high current density of extracted ions. The ion source a is held at a potential above ground (i.e., the silicon wafer potential) equal to the accelerating voltage $V_a$ of the ion implanter: the energy of the ions E as they impact the wafer substrate is given by $E=qV_a$, where q is the electric charge per ion.

The cathode h is typically a hot filament or indirectly-heated cathode, which thermionically emits electrons when heated by an external power supply. It and the anticathode are typically held at a voltage $V_c$ between 60V and 150V below the potential of the ion source $V_a$. High discharge currents D can be obtained by this approach, up to 7 A. Once an arc discharge plasma is initiated, the plasma develops a sheath adjacent to the surface of the cathode h, since the cathode h is immersed within the arc chamber and is thus in contact with the resulting plasma. This sheath provides a high electric field to efficiently extract the thermionic electron current for the arc; high discharge currents can be obtained by this method.

The discharge power P dissipated in the arc chamber is $P=DV_c$, or hundreds of watts. In addition to the heat dissipated by the arc, the hot cathode h also radiates power to the arc chamber d walls. Thus, the arc chamber d provides a high temperature environment for the dopant plasma, which also boosts ionization efficiency relative to a cold environment by increasing the gas pressure within the arc chamber d, and by preventing substantial condensation of dopant material on the hot chamber walls.

If the solid source vaporizer ovens e or f are used, the vaporized material feeds into the arc chamber d through vaporizer feeds k and l, and into plenums m and n. The plenums serve to diffuse the vaporized material into the arc chamber d, and are at about the same temperature as the arc chamber d. Radiative thermal loading of the vaporizers by the arc chamber also typically prevents the vaporizers from providing a stable temperature environment for the solid feed materials contained therein below about 100° C. Thus, only solid dopant feed materials that both vaporize at temperatures >100° C. and decompose at temperatures >800° C. can be vaporized and introduced by this method.

The emerging field of cluster ion beam implantation has introduced ion sources that operate in a different mode of ionization and perveance regime of ion beam extraction. These ion sources are unlike the Bernas-style sources in that they have been designed to produce "clusters" or conglomerates of dopant atoms in molecular form including ions of the form $As_n^+$, $P_n^+$, $C_nH_m$ or $B_nH_m^+$, or more generally encompassing molecular formulas such as $A_nH_m^+$, or $A_nRH_m^+$, where n and m are integers with $n \geq 1$ and m greater than or equal to 0, and A is carbon, boron, indium, arsenic, phosphorus, or antimony and R is a non-dopant molecule comprised of atoms such as Si, Ge, F, H or C which are not injurious to the implantation and doping process, or to device performance. Such ionized clusters or molecular ions can be implanted much closer to the surface of the silicon substrate and at higher dose rates relative to their monomer (n=1) counterparts, and are therefore of great interest for forming ultra-shallow p-n transistor junctions, for example in transistor devices of the 65 nm, 45 nm, or 32 nm generations. These cluster sources generally preserve the parent molecule, while in special cases can also produce lower-order clusters, such as $C_{14}H_{14}$ producing $C_7H_7$ ions, as shown in FIG. 5, of the feed gases introduced into the ion source in generating the ion beam. For example, the method of cluster implantation and cluster ion sources has been described in U.S. Pat. Nos. 6,452,338; 6,686,595; 6,744,214 and U.S. Pat. No. 7,107,929, all hereby incorporated by reference.

The above-identified patents disclose an ion source operable in a non arc discharge mode of operation; namely, a direct electron impact mode of operation in which neutral gas or vapor fed into an ionization chamber is ionized by direct electron impact. The ion source is configured such that the ionization chamber is in intimate thermal and mechanical contact with a vaporizer valve on the vaporizer through a thermally conductive metal gasket, which, in turn, is in intimate thermal contact with the vaporizer through a thermally conductive, thin metal gasket. This configuration provides temperature control of the ionization chamber through thermal contact with the vaporizer. This feature is important, since the plasma generated in the ionization chamber can heat the walls of the chamber to temperatures which can cause decaborane or other low-temperature vaporized materials to break down and disassociate.

In the case of the above-identified patents, the ionization chamber is rectangular, made of a single piece of machined aluminum, molybdenum, graphite, or other suitable thermally conductive material. The ionization chamber may be approximately 3 inches tall by 2 inches wide by 2 inches deep and the chamber wall thickness approximately 0.38 inch, for example. Thus, the ionization chamber has the appearance of a hollow, rectangular five-sided box. The sixth side of the ionization chamber includes an exit aperture, described below. The flow rate of the gas fed into the ionization chamber must be sufficient to maintain proper feed gas pressure within the ionization chamber. For most materials, including decaborane, a pressure between 0.5 mTorr and 5 mTorr will yield good ionization efficiency. The ion gauge mounted in the source housing, typically used in commercial ion implanters to monitor source pressure, would typically read between $1 \times 10^{-5}$ Torr and $1 \times 10^{-4}$ Torr. In such an application, the flow rate from the vaporizer or gas feed into the ionization chamber required to sustain this pressure would be between 1 sccm and 5 sccm (standard cubic centimeters per minute).

In order to ionize the gases within the ionization chamber, energetic electrons must be introduced into the ionization chamber. Accordingly, a high current electron gun is mounted adjacent to one end of the ionization chamber, but external to that chamber, such that a directed stream of energetic electrons is injected into the ionization chamber along the long axis of the rectangular chamber. The cathode of the electron gun is held at an electric potential below the potential of the ionization chamber by a voltage equal to the desired energy of the electron beam. Two apertures are provided in the ionization chamber wall to accommodate the electron beam, one aperture for entrance of the beam and a second aperture for the exit of the beam. After the electron beam exits the ionization chamber, it is intercepted by a beam dump located just outside of the ionization chamber. The electron beam is of a variable energy and current to accommodate the specific ionization needs of the various feed materials introduced into the ionization chamber, and also the specific ion currents required by the ion implant processes of the end user. In particular, the electron gun provides an electron beam energy programmable between 20 eV and 1 keV. The lowest beam energies in this energy range would accommodate selective ionization of the gas below certain ionization threshold energies, limiting the different kinds of end-product ions produced from the neutral gas species. An example would be producing $B_{10}H_x^+$ ions without significant production of $B_9H_x^+$, $B_8H_x^+$, and other lower-order boranes frequently contained in the decaborane cracking pattern when higher electron impact energies are used. The highest beam energies in the energy range of the electron gun would accommodate the formation of multiply-charged ions, for example, B++ and $B^{3+}$ from $BF_3$ feed gas. For the majority of ion production from the various feed gases used in semiconductor manufacturing, including the production of $B_{10}H_x^+$ from decaborane, an electron beam energy between 50 eV and 150 eV would yield good results.

The electron beam also accommodates a range of injected electron beam currents between 1 mA and 5 A, in order to determine the ion current extracted from the ion source. Control of electron current is accomplished by a closed loop electron gun controller which adjusts the electron emitter temperature and the electron gun grid potential to maintain the desired electron current set point. The electron emitter, or cathode, emits electrons by thermionic emission. It must therefore operate at elevated temperatures. To this end, the cathode may be directly heated by passing an electric current through the cathode material, or indirectly heated. Cathode heating by electron bombardment from a hot filament held behind the cathode is an indirect heating technique well-practiced in the art. The cathode may be made of tungsten, tantalum, lanthanum hexaboride ($LaB_6$), or other refractory conductive material. $LaB_6$ would offer a particular advantage, in that it emits copious currents of electrons at lower temperatures than tungsten or molybdenum.

The shape of the electron beam may have a rectangular cross section; approximately 0.75 inch.×0.25 inch as injected into the ionization chamber. The shape of the injected electron beam is determined by the shapes of the grid and anode apertures in the electron gun, which are both approximately 0.75 inch×0.25 inch, and also by the shape of the cathode or electron emitter, which is somewhat larger than the grid and anode apertures, approximately 0.9 inch×0.35 inch. The purpose of generating a rectangular electron beam profile is to match the desired ion beam profile as extracted from the ion source, which is also rectangular. The rectangular exit aperture from which the ion beam is extracted is approximately 2 inches tall by 0.5 inch wide; the electron beam and thus the ions produced by electron impact would present a profile to the exit aperture within the ionization chamber of approximately 2.5 inch×.0.75 inch.

Unlike known arc discharge type ion sources, the ionization chamber in a direct electron impact ion source includes both an entrance and exit aperture for the electron beam. In known Bernas type ion sources, energetic electrons produced by an emitter internal to the ionization chamber are allowed to strike the walls of the ionization chamber which forms of an "arc discharge" and in doing so generates a substantial heat load which elevates the temperature of the ionization chamber. In a direct electron impact ion source, the ionizing electrons, called energetic or "primary" electrons, pass through the ionization chamber, substantially without intercepting the chamber walls. However, the "secondary" electrons, or the low-energy electrons produced by ionization of the feed gas, can strike the ionization chamber walls. Since these are low energy electrons, they do not provide a significant heat load to the ionization chamber. This feature allows the ionization chamber in a direct electron ion source to be conductively cooled by the vaporizer without providing a large heat load on the vaporizer temperature controller. In such direct electron impact ion sources, to further contain the heat generated by the electron gun and the energetic electron beam, both the electron gun and the electron beam dump are mounted on a water-cooled shield, called the source shield. This shield is cooled by low-resistivity, de-ionized water commonly provided in commercial ion implanters.

Larger cluster ions, such as $B_{18}H_{22}$, are relatively fragile and are at risk of disassociation or fragmentation when exposed to the heat and UV radiation that is abundant in conventional arc discharge type ion sources. Although cluster ions are preferably formed using direct impact ionization, other conventional sources have been used for ionization of cluster feed material. As such, cluster ions are preferably formed using direct electron impact ionization. In such direct electron ion sources, an electron source, from which an electron beam of up to 100 mA is extracted and formed using electron optics, is situated outside the ionization chamber. With such a configuration, the hot filament is removed from the source and the fragmentation of the cluster feed stock material is minimized. The electron beam power that is injected into the source is only few tens of Watts. The produced densities of cluster ions are much lower than the conventional implant species, typically on the order of $5E^{10}/cm^3$. Due to the lower ion density in order to extract commercially viable amounts of cluster ions the area of the extraction slot should be much larger than a traditional IHC source extraction slot, typically on the order of 10 $cm^2$.

Known vaporizers are suitable for vaporizing solid materials such as decaborane ($B_{10}H_{14}$), $C_{14}H_{14}$, $C_{16}H_{10}$, $B_{18}H_{22}$, $P_7(SiMe_3)_3$ and TMI (trimethyl indium), which have relatively high vapor pressures at room temperature, and thus vaporize at temperatures around 100° C. The ovens traditionally associated with the Bernas sources typically operate at temperatures greater than 100° C., e.g. from 100° C. to 800° C. due to the characteristics of the feed materials to be converted to a gas for introduction into the ion source.

Thus, there is a need for a multi-mode ion source for ionization of both conventional species of feed material and ionization of cluster feed material. In addition, there is a need for a multi-mode ion source for use in both an arc discharge mode and a non-arc discharge mode.

SUMMARY OF THE INVENTION

Briefly, the present invention relates to a multi mode ion source ion source configured to ionize both a specie of conventional feed material and a cluster feed material. Further, the present invention relates to a multi-mode ion source configured to ionize vapor feed material in a first ionization volume and to ionize a gaseous feed material in another ionization volume. In addition, the present invention relates to a multi-mode ion source configured to operate in both an arc discharge mode and a non-arc discharge mode, e.g. a direct electron impact mode. In accordance with an important aspect of the invention, the ion source includes at least two (2) ionization volumes aligned along a common axis, e.g., the beam line axis of the ion implantation system. One ionization volume is adapted to ionize gaseous feed material with an arc discharge plasma and the other ionization volume is adapted to ionize molecular feed material with plasma, but without an active arc discharge. In accordance with another feature of the invention, the ionization volumes are electrically and thermally isolated from one another. One ion source volume being adapted to ionize gaseous feed material for the purpose of generating monomer or atomic ions with an arc discharge plasma and the other ionization volume being adapted to ionize gaseous, sublimated or vaporized materials in order to produce molecular ions, without an active arc discharge.

A further feature of the invention includes a multi mode source having at least two (2) ion sources aligned along a common axis, e.g., the beam line axis of the ion implantation system wherein each ion source has a separate ionization volume and the ionization volumes of each ion source have a dedicated extraction aperture to aid in extracting and defining the resulting ion beam. In accordance with one aspect of the invention, the extraction aperture of the conventional specie of feed material type ion source is formed with a relatively smaller area than the extraction aperture of the ion source for ionization of the cluster type feed material. For example, the aperture of the arc discharge type ion source being of much smaller area than the extraction aperture of the non arc discharge type ion source.

A further feature of the invention includes a multi mode source having at least two (2) ion sources aligned along a common axis, e.g., the beam line axis of the ion implantation system wherein each ion source has a separate ionization volume and a corresponding extraction aperture, wherein the ionization volumes are positioned in such a way that the ions extracted from the arc discharge source pass through the non-arc discharge source.

A still further feature of the invention includes a multi mode source having at least two (2) ion sources aligned along a common axis, e.g., the beam line axis of the ion implantation system wherein the non-discharge source is at a more negative potential than the arc discharge source and contains at least one ion optical element to extract said ion beam from the arc discharge source.

DESCRIPTION OF THE DRAWINGS

FIGS. 5a, 5b and 5c illustrate the configuration of the electrodes for the ionization volumes along with simulated ion beams from the respective ion sources as illustrated in FIG. 3, wherein FIG. 5a illustrates the electrode configuration of the extraction electrodes and the ground suppression electrodes for the multi-mode ion source along with a simulated ion beam extracted from a direct electron impact ionization volume; FIGS. 5b and 5c are similar but for simulated ion beams extracted from the arc discharge ionization volume for different extraction potentials. As shown, FIG. 5a illustrates a $B_{18}$ ion beam at 40 keV and 8 mA while FIG. 5b illustrates Ar ion beam at 40 kev and FIG. 5c illustrated an As ion beam at 40 keV and 25 mA.

DETAILED DESCRIPTION OF THE INVENTION

Figure 1:
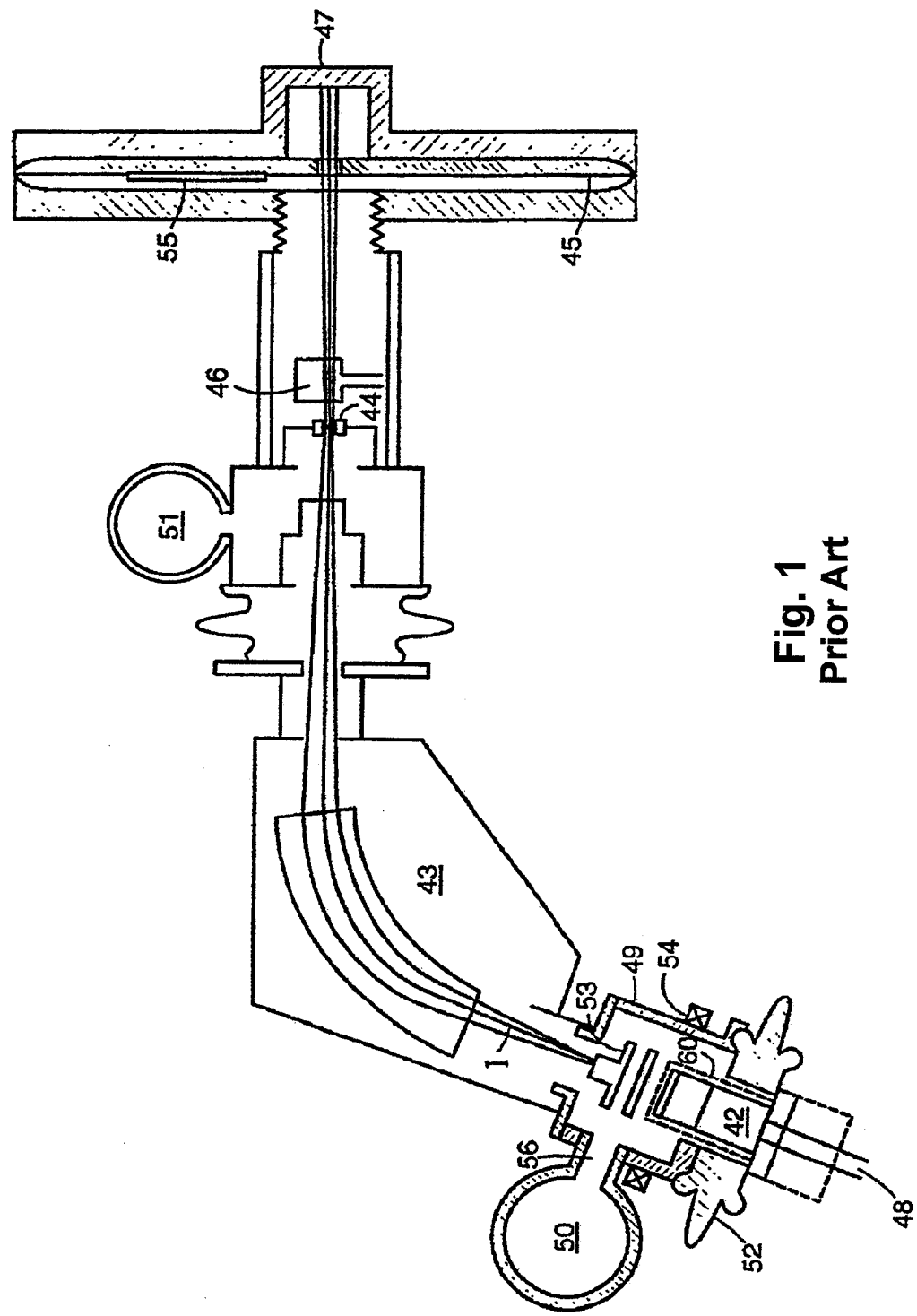
FIG. 1 shows a schematic of a prior art ion implantation system.
Figure 2:
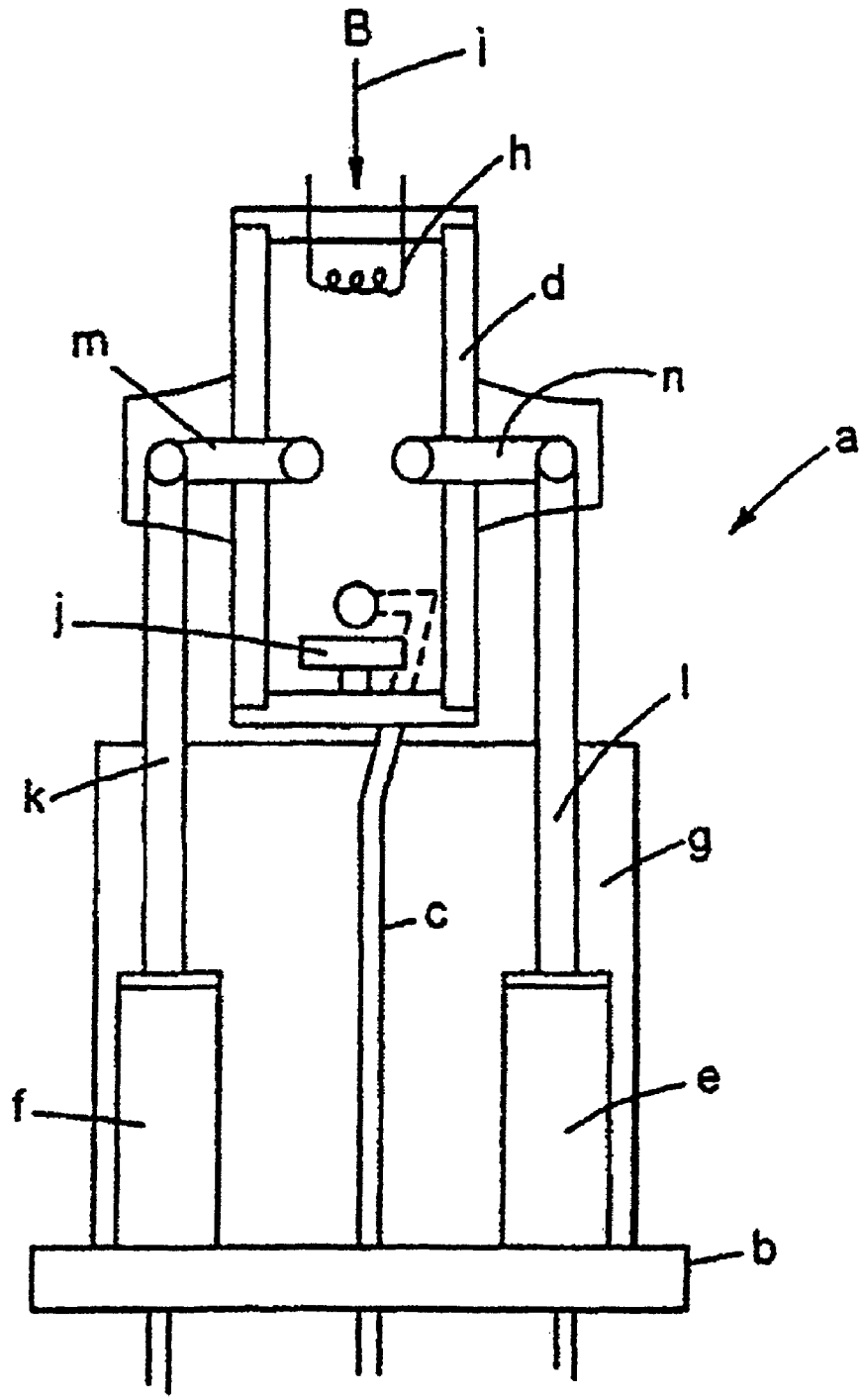
FIG. 2 is a diagrammatic view of a prior art source known as an enhanced Bernas ion source.
Figure 3:
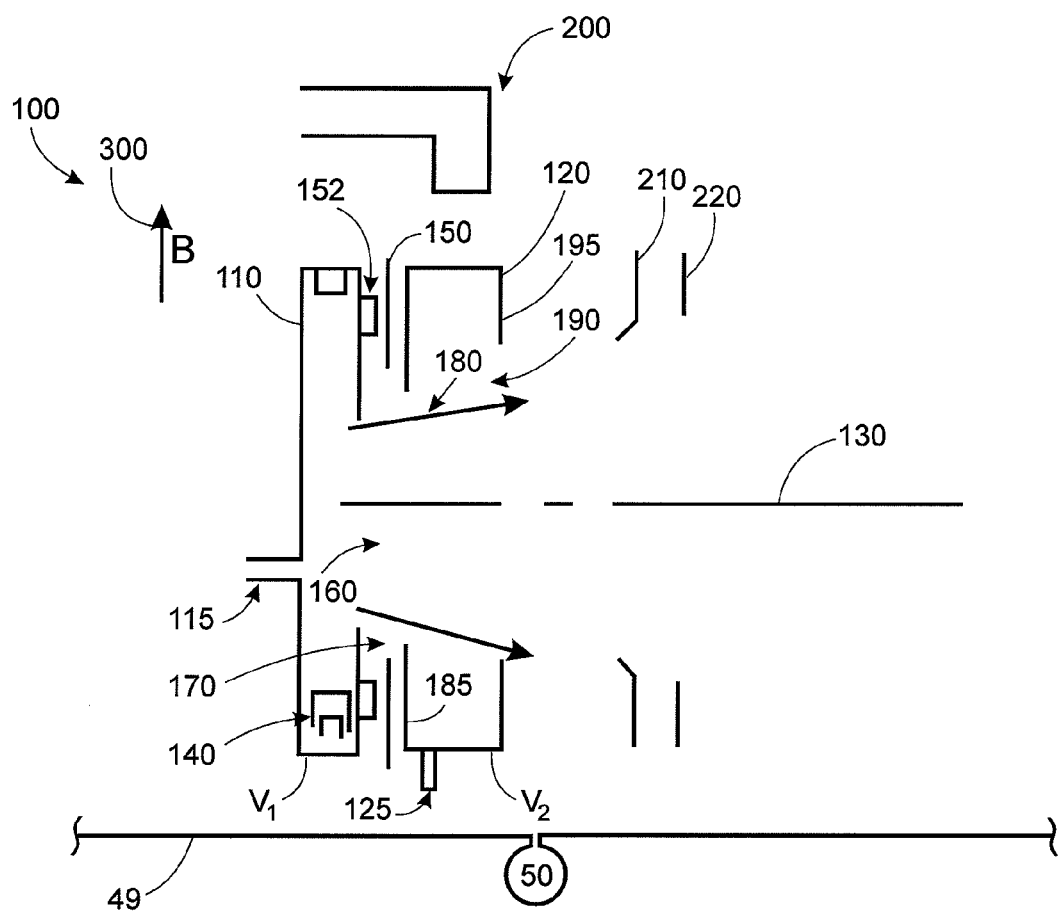
FIG. 3 is a simplified side elevational view of a multi-mode ion source in accordance with a first embodiment of the present invention shown with two ionization volumes disposed generally symmetrical relative to a common ion beam axis in which both ionization volumes are formed from chambers and in which only a portion of the source housing is shown.
Figure 4:
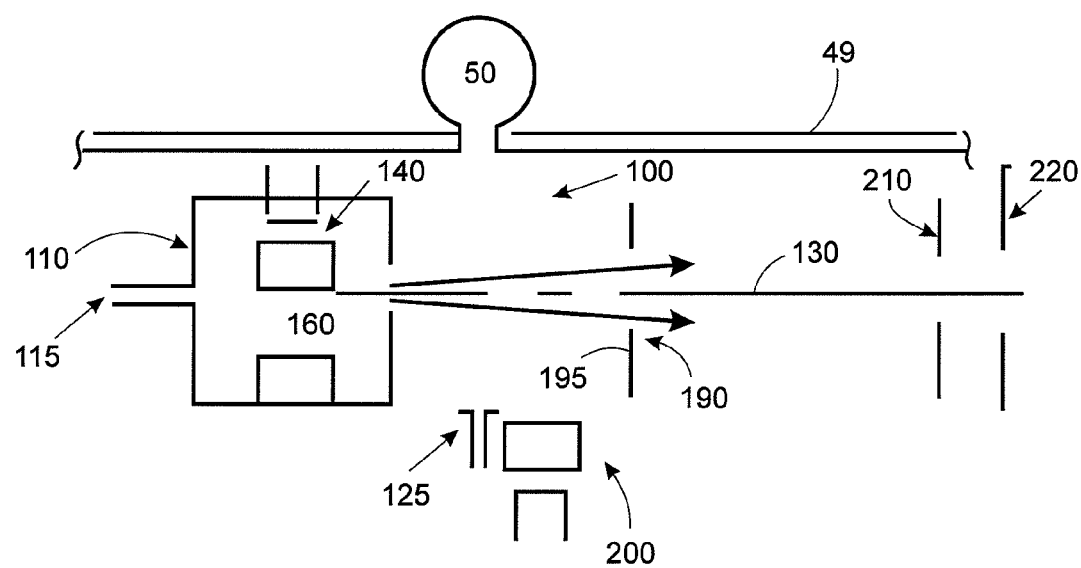
FIG. 4 is similar to FIG. 3 but illustrates an alternative embodiment in which one ionization volume is formed from a chamber and the second ionization volume is simply the space adjacent the chamber.
Figure 7:
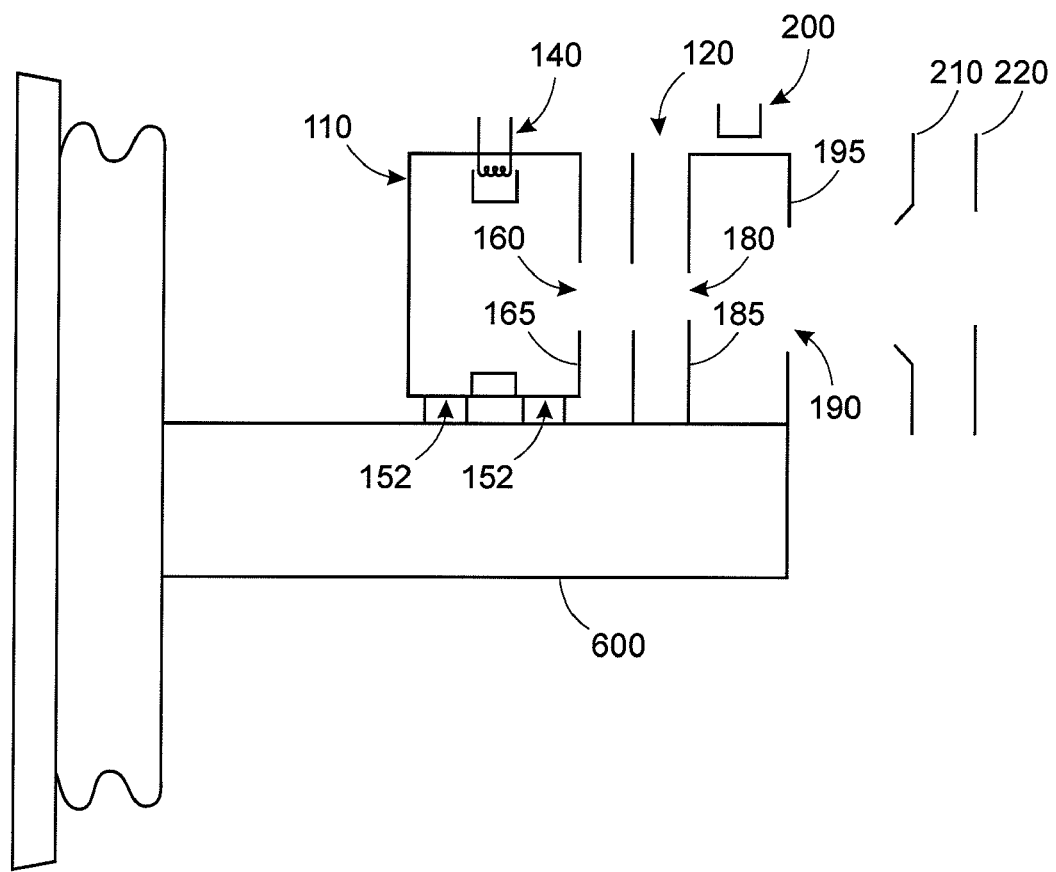
FIG. 7 is a side elevational view of an alternative embodiment of the multi-mode ion source illustrated in FIG. 3.

FIGS. 3, 4, 5 and 7 illustrate a multi mode ion source having multiple ionization volumes that are generally aligned and have a common beam line. FIGS. 3, 5 and 7 illustrate an embodiment in which each of the ionization volumes are defined by chambers. FIG. 4 illustrates an alternative embodiment in which one ionization volume is defined by a chamber and a second ionization volume is defined by the space adjacent the chamber.

Referring first to FIG. 3, a first embodiment of the multi-mode ion source 100 is illustrated shown with only a portion of a source housing 49 and vacuum pump 50 shown. The multi mode source 100 includes a first ionization chamber 110 and a second ionization chamber 120 juxtaposed in a side by side or tandem relationship with respect to each other. As will be discussed in more detail below, the chamber 110 is configured to be used with a conventional specie of feed material while the ionization volume 120 is configured to be used with a cluster feed material. In addition, the ionization volume 110 is configured to be used in an arc discharge mode while the ionization volume 120 is configured to be used in a non-arc discharge mode, such as a direct electron impact mode. An indirectly-heated cathode (IHC) 140 is disposed within the ionization chamber 110.

An gas or vapor inlet port 115 is formed in one wall of the ionization volume 110 to enable gaseous, sublimated or vaporized atomic species to be received within the ionization chamber 110. Process gas, e.g., $BF_3$, arsine, phosphine, $SbF_5$, $CO_2$ or other dopant-containing gases, is injected into the ionization chamber 110 through the inlet port 115, as is well known in the art. The gaseous or vapor atomic species are ionized within the ionization chamber 110 in order to produce a monomer ion beam along a beam line 130. More particularly, an arc plasma is formed by the IHC emitter 140 which ionizes the process gas by way of a negative arc voltage applied between the IHC emitter 140 and the ionization chamber 110, as is well known in the art (the power supply and electrical connections are not shown in the Figure). The ionized gas or beam is then extracted from the ionization chamber 110 by electrodes, as further described herein.

An external magnetic field 300 is applied along the height of the multi mode ion source 100, that is, orthogonal to the beam direction 130 and parallel to a line joining cathode and anticathode in the arc discharge source 110 as is known in the art. The magnetic field confines the electrons emitted from the IHC emitter 140 and the plasma column that is formed by the electrons.

The multi-mode ion source 100 also includes a second ionization chamber 120 configured for use in direct electron impact ionization. The ionization chamber 120 is disposed adjacent the ionization chamber 110 in a side by side or tandem relationship. The ionization chamber 120 includes a separate gas or inlet port 125 in order to receive gaseous, sublimated or vaporized molecular feed material suitable for producing molecular and cluster ions. The molecular and cluster ions are extracted to form an ion beam, aligned along a common axis, e.g., the beam line axis 130.

The ionization chamber 120 is electrically and thermally isolated from the ionization chamber 110 by means of isolation standoff 152 and a radiation shield 150. A potential can be applied between the chambers 110 and 120. Due to the configuration of the ion source 100, the heat generated by the IHC discharge source chamber 110 does not adversely affect the operation of the much cooler operational environment of the electron impact source chamber 120. In one embodiment of the invention, the ionization chamber 120 is mounted to and in thermal communication with a source block 600, for example, as illustrated in FIG. 7, which is actively temperature controlled to a given temperature, for example, as disclosed in U.S. Pat. No. 6,686,595, hereby incorporated by reference, thus preventing either thermal dissociation or condensation of the cluster-producing feed materials introduced into the ionization chamber 120.

In this embodiment the potential of the ionization chamber 120 is maintained at the same potential as the potential of the source block 600. The ion energy of the formed beam is given by $E=eV_e$, where $V_e$ is the extraction supply potential. When the ionization chamber 120 is active, the ionization chamber 110 is inactive and is maintained at the same potential as 120, namely at $V_e$. When chamber 110 is active, it is held at $V_e$, but chamber 120 is held at a negative potential V with respect to $V_e$, i.e., $V<V_e$. Thus, the ions produced in chamber 110 exit through aperture 160 in the downstream wall formed as an electrode, 165, and are accelerated into aperture 180 resident in chamber 120.

In order to extract the ionized beam from the source chamber 110 or 120, it is well known to use a slot in the downstream wall of the chamber aligned with the beam line. In this multi mode source 100, in order to extract the beam from the ionization chamber 110, a slot 160 is formed in the downstream wall of the chamber as an electrode, 165 (FIGS. 5a-5c and 7) of the IHC discharge chamber 110 and aligned with an opening 170 formed in the standoff 150. The opening 170 is, in turn, aligned with a slot 180 in an upstream wall, 185 of the ionization chamber 120, which, in turn, is aligned with another slot 190 in the downstream wall of the ionization chamber 120, formed as an electrode 195. The electrode 165 or slot 180 may act as a plasma electrode for extracting the IHC plasma ions from chamber 110, which may be accomplished by applying a negative potential to the ionization chamber 120 with respect to the ionization chamber 110. With such a configuration an ion beam from the ionization chamber 110 travels through the ionization chamber 120 along the beam-line axis 130. Ion beams generated in the ionization chamber 120 similarly travel along the beam-line axis 130.

For producing the cluster ions in the ionization chamber 120, an electron gun 200 is disposed outside of the chamber 120. A cluster, such as $B_{18}H_{22}$, or molecular feed material is fed into the ionization chamber 120, e.g., through a port 125 opening directly into the electron impact source chamber 120. As discussed, for example, in U.S. Pat. No. 7,107,929, hereby incorporated by reference, power is applied to the electron gun 200 and the electrons emitted from the electron gun 200 are trapped by the external magnetic field 300 and form an ionization column, from which cluster ions are extracted by an extraction electrode 195 which forms the slot 190. Ions are accelerated to the full energy over the extraction gap between extraction electrode 195 and suppression electrode 210, which sits in a negative potential as is known in the art. The suppression electrode 210 is followed by a ground electrode 220. Electrodes 210 and 220 are moveable back and forth along the beam line direction 130 with respect to the slot 190 as the ion beam energy changes, e.g., in the embodiments discussed above, a small gap is needed for low energy and large gap for higher energies.

FIG. 4 illustrates an alternative embodiment of the multi mode ion source 100 in accordance with the invention. This embodiment includes an ionization chamber 110, including its IHC emitter 140, as described above, for use in an arc discharge mode and a slot 160. In accordance with an important aspect of this embodiment of the invention, the source housing walls 49, only a portion being shown, and the airspace downstream of the ionization chamber 120 define the ionization volume for the direct electron impact mode of operation. More particularly, in this embodiment, the radiation shield 150 and associated slot 170, as well as chamber 120 and slot 180 are eliminated. This embodiment of the invention also includes the electron impact electron gun 200, electrode 195 with slot 190, the source housing 49, the pump 50, and electrodes 210 and 220.

The operation of the IHC discharge chamber 110 functions as described above, except that the electrode 195 may be used as the extraction electrode for the IHC discharge source chamber. More significantly, the electron impact source is formed by the electron impact electron gun 200, source housing walls 49 and the electrode 195 incorporating slot 190. The electron gun 200 ionizes the molecular gas introduced into the source 100 via port 125. The ionized molecular beam is extracted through slot 190 as described above.

Figure 5A:
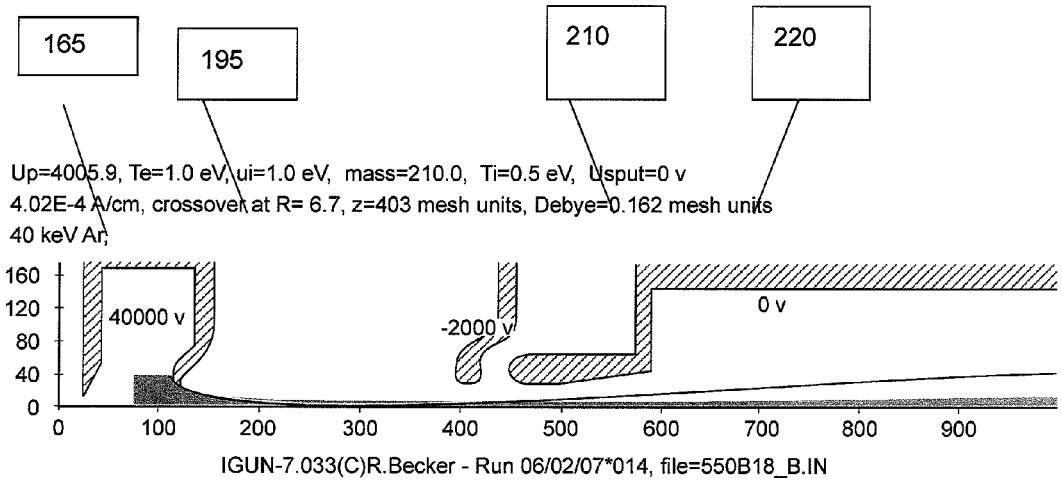
Figure 5B:
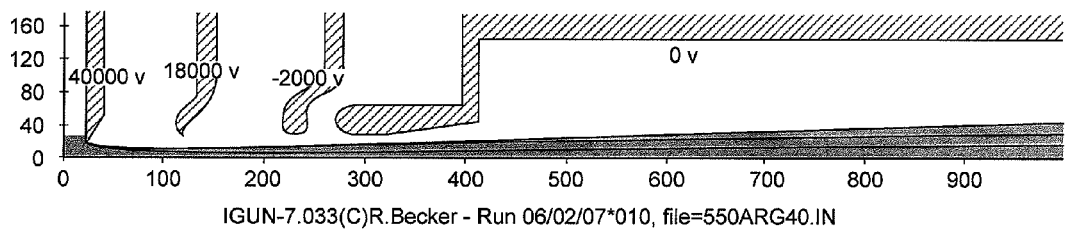
Figure 5C:
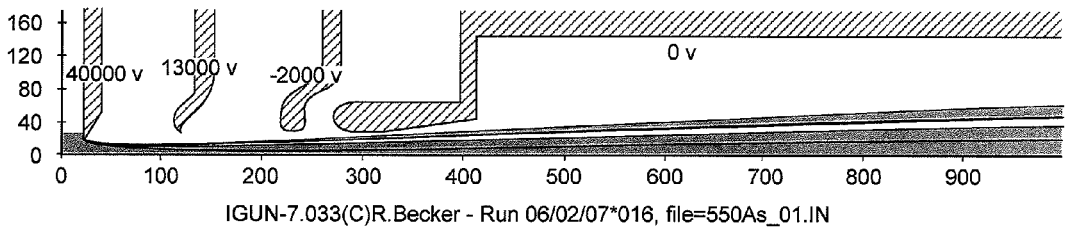

FIGS. 5a, 5b and 5c illustrate the configuration of the electrodes for the ionization volumes along with simulated ion beams from the respective ion sources as illustrated in FIG. 3, wherein FIG. 5a illustrates the electrode configuration of the extraction electrodes and the ground suppression electrodes for the multi-mode ion source along with a simulated ion beam extracted from a direct electron impact ionization volume; FIGS. 5b and 5c are similar but for simulated ion beams extracted from the arc discharge ionization volume for different extraction potentials. More particularly, FIG. 5a illustrates a cluster extraction mode of the electron impact source through extraction slot 190 of electrode 195 and electrodes 210 and 220. In this mode the IHC discharge chamber 110 and the electron impact chamber 120 are at the same potential and ions are produced by the electron beam emitted from electron gun 200 which ionizes the cluster feed material injected into chamber 120 through a the port 125. The extraction gap between electrodes 195 and 210 is relatively large due to the lower cluster ion density. FIGS. 5b and 5c show the extraction operation in connection with the arc plasma discharge mode of the IHC discharge chamber 110. A potential is applied to each source chamber 110, V1, and 120, V2, wherein V1 is greater than V2, and the ions produced by the IHC discharge chamber 110 are extracted from the plasma in chamber 110 through the slot 160 of the electrode 165. The extraction gap between electrodes 165 and 195 is fixed; however, the potential can be varied, as illustrated in FIGS. 5b and 5c. Furthermore, the gap between electrode 195 and electrode 210 has been determined to affect the expansion of the ion beam such that, in the arc discharge mode produced by the IHC discharge source 110, the gap should be much smaller than the gap between the electrode 195 and electrode 210 when the electron impact source 120 is producing a molecular ion beam.

Figure 6:
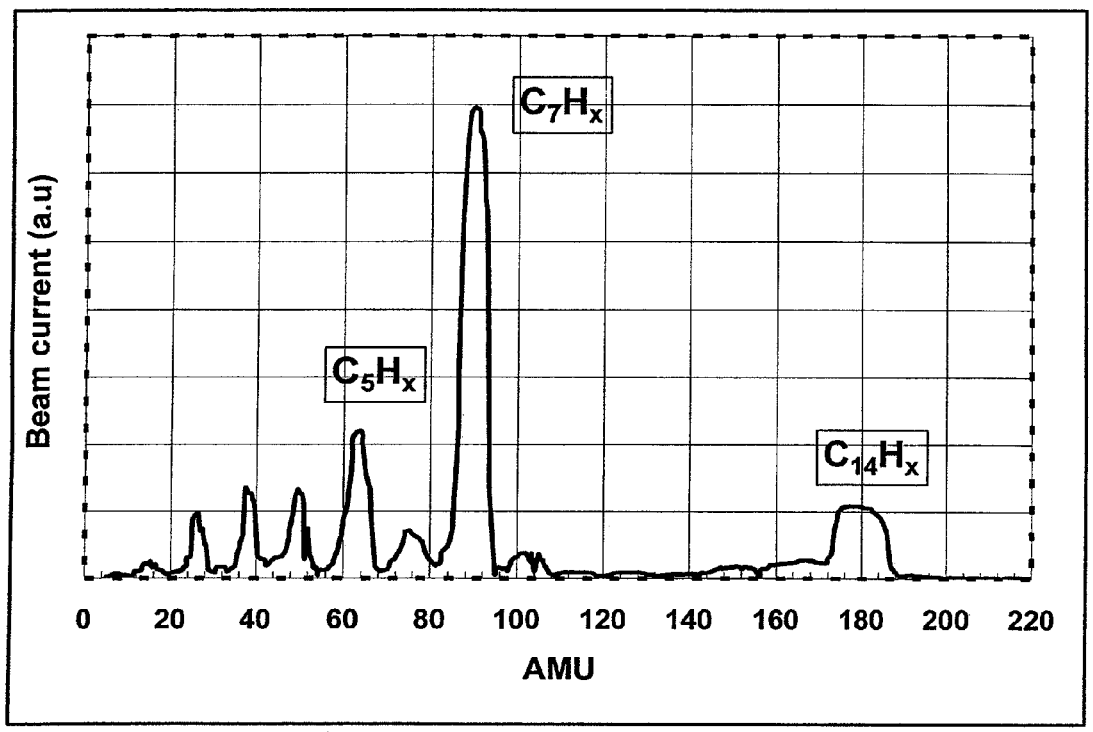
FIG. 6 is amass spectrum of $C_{14}H_{14}$.

Referring to FIG. 7, multi-mode two ion sources in tandem, such as shown in FIG. 7. The tandem approach preserves the geometry of most conventional ion implanters, requiring minimal changes to their beam forming optics. The first source 110 is in most respects a conventional Bernas-type source commonly in use today, having the ability to crack fluorinated compounds such as $BF_3$ and $SBF_5$, and producing copious amounts of monomer ion currents and multiply-charged ions. The second source 120 is an electron-impact type source as disclosed, for example, U.S. Pat. Nos. 6,452,338; 6,686,595 and 7,107,929, hereby incorporated by reference, and used for the purpose of generating molecular ions and clusters, such as, $B_{18}H_x^+$, $B_{10}H_x^+$, $C_7H_x^+$, for example, as illustrated in FIG. 6, ions derived from $P_7(SiMe_3)_3$, and others. A source 120 is coupled to a source block 600, as is discussed in the aforementioned patents. As shown, the Bernas source 110 is separated from the source block 600 by standoffs 152. By using such a configuration, each source can be operated independently at their optimum temperatures. In addition, the size of the extraction slots of each source can be likewise separately optimized for the higher plasma density of the Bernas-type source and the lower plasma density of the electron impact source.

Separation of feed gases is also a feature of the invention, so that thermally sensitive vapors such as $B_{18}H_{22}$ are not fed into a hot ionization chamber 120. Also, when cleaning gases are required, such as F cleaning of deposits formed by $B_{18}H_{22}$, for example, the F can be fed separately into the source running $B_{18}H_{22}$, and not unduly expose the Bernas source to F etching.

Switching between species (e.g., monomer versus cluster) is accelerated by this technique since the unused source is in standby, so that required F cleaning, or cooling of hot parts, do not contribute to the species change times, increasing the available beam time of the implanter, reducing processing costs.

We claim:

1. A multi-mode ion source comprising:
    a first ion source for ionizing a first gas by way of an arc discharge, said first ion source having a first ionization volume and a first extraction aperture;
    a second ion source for ionizing a second gas, said second source being a non-arc discharge source, said second ion source having a second ionization volume and a second extraction aperture, wherein the first and second ion sources are aligned along a common beam line axis of said multi-mode ion source such that the first and second extraction apertures are aligned so that ions extracted from the first ion source pass through the second ion source.

2. A multi-mode ion source comprising:
an arc discharge source for ionizing an atomic gas species in a first mode of operation; and
an electron impact ion source for ionizing a molecular gas species in a second mode of operation; wherein the arc-discharge source is aligned in tandem along a common beam line axis with the electron impact source such that the ions of the arc discharge source are extracted through an extraction aperture in the electron impact source.

3. A multi-mode ion source comprising:
an arc discharge ion source for ionizing an atomic gas species in a first mode of operation and producing atomic ions ; and
an electron impact ion source for ionizing a molecular gas species in a second mode of operation; wherein said arc discharge ion source and said electron impact ion source are aligned on a common beam line axis.

4. An apparatus for providing ions to an ion implantation device, the apparatus configured to have at least two discrete modes of operation, the apparatus comprising:
a first ionization chamber and an electron source for ionizing gas species in an arc discharge mode which produces atomic ions and an aperture through which the ions are extracted; and
a second ionization chamber and an electron source for ionizing gas species in a non arc discharge mode of operation which produces molecular ions , a first aperture through which the ions are extracted and a second aperture aligned with the first aperture and the aperture in the first ionization chamber.

5. A multi-mode ion source which provides ions to an ion implantation device, the multi-mode ion source having two discrete modes of operation;
an arc discharge mode for producing atomic ions and a non-arc discharge mode for producing molecular ions , the multi-mode ion source comprising:
a first ion source having a first ionization chamber, a first gas inlet port and an electron source for ionizing gas species in an arc discharge mode, said first ionization volume having a first electron extraction aperture through which the ions from said first extraction aperture are extracted; and
a second ion source having a second ionization volume, a second gas inlet port and an electron source for ionizing gas species in a non arc discharge mode of operation, a second extraction aperture through which the ions are extracted, wherein said first extraction aperture and said second aperture are aligned along a common axis defining a beam line.

6. The multi-mode ion source as recited in claim 5, wherein said first extraction aperture is relatively smaller than said second extraction aperture.

7. The multi-mode ion source as recited in claim 5, wherein said first and second ion sources are juxtaposed such that in an arc discharge mode, ions from said first ion source pass through said second ion source.

8. The multi-mode ion source as recited in claim 5, wherein said multi-mode ion source includes a source housing with walls which form said second ionization volume along with the air space down stream of the first ionization chamber.

9. The multi-mode ion source as recited in claim 5, wherein said second electron extraction aperture is formed as a slot in an extraction electrode.

10. The multi-mode ion source as recited in claim 8, wherein said second electron extraction aperture is formed as a slot in an extraction electrode.

11. The multi-mode ion source as recited in claim 5, wherein said second ion source is maintained at relatively more negative potential than said first ion source.

12. The multi-mode ion source as recited in claim 5, further including at least one ion optical element disposed along said common axis.

13. The multi-mode ion source as recited in claim 12, wherein said at least one ion optical element includes a suppression electrode.

14. The multi-mode ion source as recited in claim 12, wherein said at least one ion optical element includes a ground electrode.

15. The multi-mode ion source as recited in claim 5, wherein said first ion source comprises an indirectly heated cathode.

16. The multi-mode ion source as recited in claim 5, wherein said second ion source comprises an electron gun.

17. The multi-mode ion source as recited in claim 5, wherein one wall of the first ionization chamber comprises an electrode with a slot which forms said first extraction aperture.

18. The multi-mode ion source as recited in claim 5, wherein said second ionization volume comprises a second ionization chamber which includes a second gas inlet port and wherein said first and second ionization chambers are thermally and electrically isolated from one another.

19. The multi-mode ion source as recited in claim 18, wherein one wall of said second ionization chamber comprises an electrode with a slot which forms said second extraction aperture.

20. The multi-mode ion source as recited in claim 19 wherein one wall of the first ionization chamber comprises an electrode with a slot which forms said first extraction aperture.

21. The multi-mode ion source as recited in claim 18, further including a source block.

22. The multi-mode ion source as recited in claim 21, wherein said second ionization chambers is mounted to said source block.

23. The multi-mode ion source as recited in claim 21, wherein said first ionization chambers is mounted to said source block by way of at least one stand-off formed to enable each source to be operated independently.

* * * * *